United States Patent
Kotrc

(10) Patent No.: US 10,775,823 B2
(45) Date of Patent: Sep. 15, 2020

(54) METHOD OF FORMING A SEMICONDUCTOR DEVICE

(71) Applicant: SEMICONDUCTOR COMPONENTS INDUSTRIES, LLC, Phoenix, AZ (US)

(72) Inventor: Vaclav Kotrc, Roznov pod Radhostem (CZ)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

(21) Appl. No.: 16/659,480

(22) Filed: Oct. 21, 2019

(65) Prior Publication Data

US 2020/0241584 A1    Jul. 30, 2020

Related U.S. Application Data

(60) Provisional application No. 62/796,663, filed on Jan. 25, 2019.

(51) Int. Cl.
  *G05F 1/625* (2006.01)
  *H03F 1/02* (2006.01)

(52) U.S. Cl.
  CPC .......... *G05F 1/625* (2013.01); *H03F 1/0233* (2013.01)

(58) Field of Classification Search
  CPC ........................................... G06F 1/625
  USPC .................................. 327/540, 541; 323/265
  See application file for complete search history.

(56) References Cited

U.S. PATENT DOCUMENTS

| | | | |
|---|---|---|---|
| 9,000,742 B2* | 4/2015 | Chen | G05F 1/56 323/265 |
| 2009/0195290 A1* | 8/2009 | Moraveji | G05F 1/575 327/331 |
| 2010/0315158 A1* | 12/2010 | Atrash | G05F 1/565 327/541 |
| 2013/0119954 A1 | 5/2013 | Lo | |
| 2013/0147448 A1* | 6/2013 | Kadanka | G05F 1/565 323/280 |
| 2015/0061757 A1* | 3/2015 | Guo | G05F 1/575 327/540 |
| 2015/0220096 A1 | 8/2015 | Luff | |
| 2016/0240251 A1* | 8/2016 | Shih | G11C 13/0069 |
| 2019/0146530 A1* | 5/2019 | Kotrc | G05F 1/562 323/265 |

* cited by examiner

*Primary Examiner* — Tomi Skibinski
(74) *Attorney, Agent, or Firm* — Robert F. Hightower

(57) ABSTRACT

In one embodiment, an LDO circuit is configured to increase a bias current to an error amplifier of the LDO circuit, and to subsequently return the bias current to an earlier value in response to the output current increasing to greater than a threshold current level.

20 Claims, 4 Drawing Sheets

METHOD OF FORMING A SEMICONDUCTOR DEVICE

CROSS-REFERENCE TO RELATED APPLICATIONS

This application claims the benefit of U.S. Provisional Patent Application No. 62/796,663, filed on Jan. 25, 2019, the entire contents of which is incorporated herein by reference.

BACKGROUND OF THE INVENTION

The present invention relates, in general, to electronics, and more particularly, to semiconductors, structures thereof, and methods of forming semiconductor devices.

In the past, the semiconductor industry utilized various methods and circuits to form low dropout (LDO) regulators that supplied a regulated output voltage and an output current to a load. The LDO regulators were linear regulators that often included an error amplifier and a transistor in order to form the output voltage and current.

In some operational conditions, the load may be operating in a low power consumption mode which only required a low value of output current. Later, the load may change and may start requiring a high output current. However, the error amplifier often had a long transient response time and could not immediately begin supplying the higher value of the output current. Consequently, the value of the output voltage often decreased as the regulator transitioned from providing a low output current to being able to supply the higher value of output current. The lower value of output voltage may cause improper operation of the load.

Accordingly, it is desirable to have a method and apparatus that can more rapidly increase the output current from a low value to a higher value.

Figure 1:
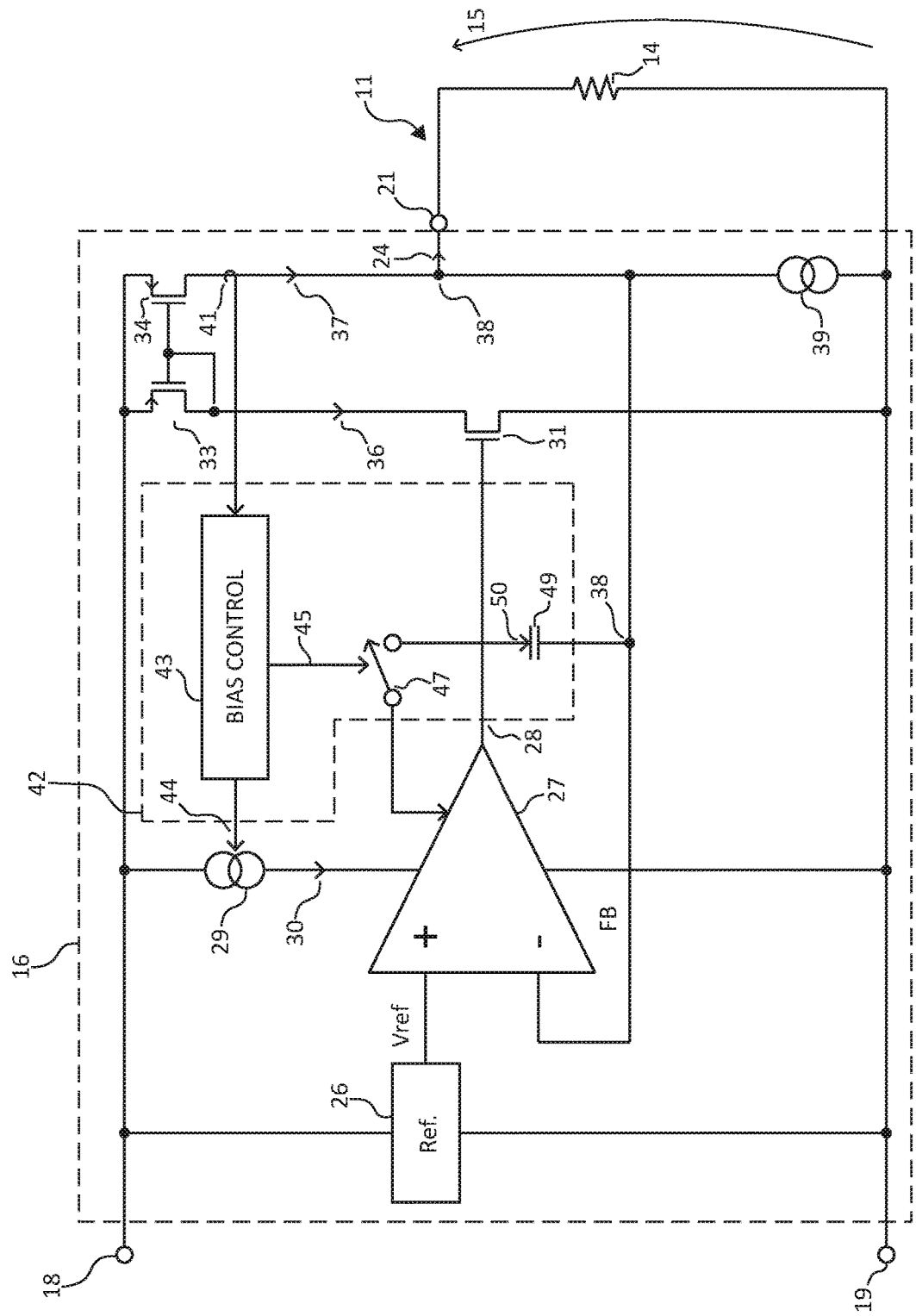
FIG. 1 schematically illustrates an example of an embodiment of a portion of a low dropout (LDO) regulator system in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of an MOS transistor or an emitter or a collector of a bipolar transistor or a cathode or anode of a diode, and a control element or control electrode means an element of the device that controls current through the device such as a gate of an MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for some elements including semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

The embodiments illustrated and described hereinafter suitably may have embodiments and/or may be practiced in the absence of any element which is not specifically disclosed herein.

DETAILED DESCRIPTION OF THE DRAWINGS

FIG. 1 schematically illustrates an example of an embodiment of a portion of a low dropout (LDO) regulator system 10 that supplies an output voltage 15, illustrated in a general manner by an arrow, to a load 11. System 10 also supplies a load current 24 to load 11. Although load 11 is illustrated as a resistor 14, those skilled in the art will appreciate that the load can be many different types of active and/or passive circuits.

System 10 may also include an LDO regulator circuit or LDO regulator or regulator 16 that receives an input voltage between a voltage input terminal 18 and a common return terminal 19, and regulates output voltage 15 to a desired value. The voltage received between terminals 18 and 19 may be various types of voltages including a DC voltage, an alternating DC voltage, or a voltage that is formed from rectifying an AC voltage. Regulator 16 regulates output voltage 15 to the desired value within a range of values around the desired value. For example, the desired value may be three volts (3v) and the range of values may be plus or minus five percent (5%) around the three volts. Regulator 16 also forms load current 24. An embodiment of regulator 16 may include an error amplifier 27, a reference circuit or Ref 26, a control transistor 31, an output current mirror that is formed by the current mirror configuration of transistors 33 and 34, and an output 21 that supplies load current 24 and forms output voltage 15 between output 21 and terminal 19.

Error amplifier 27 receives a feedback (FB) signal that is representative of voltage 15 and receives a reference voltage (Vref) from Ref 26. Those skilled in the art will understand that amplifier 27 controls transistor 31 to regulate voltage 15 to the desired value which is substantially proportional to the value of Vref. Those skilled in the art will also appreciate that a voltage divider or other circuitry may be utilized to form the feedback (FB) signal to be representative of the value of voltage 15. Amplifier 27 receives a bias current 30 from a bias current source 29. Bias current 30 sets the operating point for the internal differential amplifier of amplifier 27 which therefore assists in forming the transient response time for amplifier 27. In regulating voltage 15, amplifier 27 forms an output signal 28 that adjusts a current 36 through transistor 31 which is mirrored through the current mirror configuration of transistors 33 and 34 to form an output mirror current 37. Current 37 includes current 24. A current source 39 sinks the portion of current 37 that exceeds the value of current 24. In some embodiments, source 39 may be omitted such that current 37 is substantially current 24.

During normal operation, such as for example a substantially steady-state operation with substantially minor load variations, amplifier 27 adjusts signal 28 and the gate voltage of transistor 31 as required to maintain voltage 15 proportional to substantially the Vref. In the event that load 11 changes to a lower power requirement, for example a lower value of load current 24, amplifier 27 adjust signal 28 to maintain the value of voltage 15 proportional to Vref. In the event that load 11 changes and requires more power, for example a higher value of current 24, bias current 30 from current source 29 may not be sufficient to allow amplifier 27 and regulator 16 to rapidly increase the value of current 24.

However, regulator 16 also includes a bias control circuit 42 that is configured to supplement the bias current of amplifier 27. For example, circuit 42 may be configured to increase the value of current 30, or alternately supply an additional current that is summed with the current from source 29, which allows regulator 16 to more quickly increase the value of current 24. Circuit 42 may have an embodiment that may include a steering circuit 47, a current generation circuit (such as for example a capacitor 49), and a control circuit 43 that forms control signals 44 and 45. Circuit 42 may have an embodiment that also includes a current sensing circuit or current sensor 41 that senses the value of current 24 or alternately the value of current 37. Circuit 42, or alternately circuit 43, may be configured to sense that the value of current 24 is less than a threshold (Ith) value and to responsively couple amplifier 27 to circuit 42, or alternately to circuit 43, to subsequently receive an adjust bias current, or alternately to subsequently cause an increase in the value of the bias current. In an embodiment, circuit 42 may be configured to sense that the value of current 24 is less than Ith and to couple an internal bias circuit of amplifier 27 to capacitor 49. For example, circuit 42 may control circuit 47 to couple amplifier 27 to capacitor 49. Circuit 42 may be configured to form the supplemental bias current couple it to amplifier 27, or alternately may be configured to subsequently form a control signal that causes source 29 to increase the value of current 30.

In some embodiments the increased bias current may reduce the transient response of amplifier 27. As will be seen further hereinafter, an embodiment of circuit 42 may be configured to increase the bias current from a first value to a second value in response to voltage 15 decreasing to less than the desired value during a time in which current 24 is less than the threshold (Ith) value. For example, current 24 may be less than the threshold (Ith) value and voltage 15 may later decrease to less than the desired value. In another embodiment, circuit 42 may be configured to return the bias current to the first value in response to the current 24 returning to substantially no less than the Ith value. For example, circuit 42 may be configured to return the bias current to the first value after current 24 increases to greater than the threshold (Ith) value. Another embodiment of circuit 42 may be configured to selectively couple amplifier 27 in a configuration to receive a control current responsively to current 24 having a value that is less than the threshold (Ith) value and at some time after coupling amplifier 27 in this configuration to subsequently form the control current to have a value that increases the bias current to amplifier 27 from a first value to a second value in response to voltage 15 decreasing to less than the desired value. Another embodiment of circuit 42 may be configured to subsequently decouple amplifier 27 from receiving the control current in response to current 24 increasing to no less than the threshold (Ith) value.

Assume that load 11 is in a low power state so that current 24 is less than Ith. Subsequently, at some later time, load 11 may change and require an increased value of current 24. Because of the transient response of amplifier 27, the increased value of current may cause the output voltage to decrease. Thus, the voltage at a node 38 and on one terminal of capacitor 49 also decreases. The decreased voltage on the terminal of capacitor 49 causes a current 50 to flow through capacitor 49. Current 50 is coupled through circuit 47 to the bias circuit of amplifier 27. Current 50 can be added to the bias current of amplifier 27 to form an increased value of bias current. Alternately, current 50 may be used as a control signal that causes a current source to increase the current source output and thus form an increased value of bias current. The result is an increased bias current for amplifier 27. In an embodiment, current 50 through capacitor 49 may also be coupled through control circuit 43 and increase the value of signal 44 which in turn causes current source 29 to increase the value of current 30. This increased bias current to amplifier 27 allows amplifier 27 to more rapidly change the value of control signal 28 and which more rapidly increases the gate voltage of transistor 31 thereby more rapidly increasing current 36 which is mirrored to increase current 24 through the current mirror of transistors 33 and 34.

In order to facilitate the herein described functionality, regulator 16 includes an input terminal 18 commonly connected to a first terminal of Ref 26, a first terminal of source 29, a source of transistor 33, and a source of transistor 34. A drain of transistor 34 is commonly connected to node 38, output 21, a first terminal of source 39, a first terminal of capacitor 49, and an inverting input of amplifier 27. A non-inverting input of amplifier 27 is connected to the output of Ref 26. A second terminal of source 39 is commonly connected to terminal 19, a source of transistor 31, a common connection to amplifier 27, and a second terminal of Ref 26. A second terminal of source 29 is connected to a bias input of amplifier 27. An output of amplifier 27 is connected to a gate of transistor 31. A drain of transistor 31 is commonly connected to a drain of transistor 33, a gate of transistor 33, and a gate of transistor 34. An input of circuit 43 is connected to sensor 41. A first output of circuit 43 is connected to a current control input of source 29 to provide signal 44 thereto. A second output of circuit 43 is connected to control circuit 47 to provide signal 45 thereto. An output or common connection of circuit 47 is connected to a bias input of amplifier 27. An input of circuit 47 is connected to a second terminal of capacitor 49.

Figure 2:
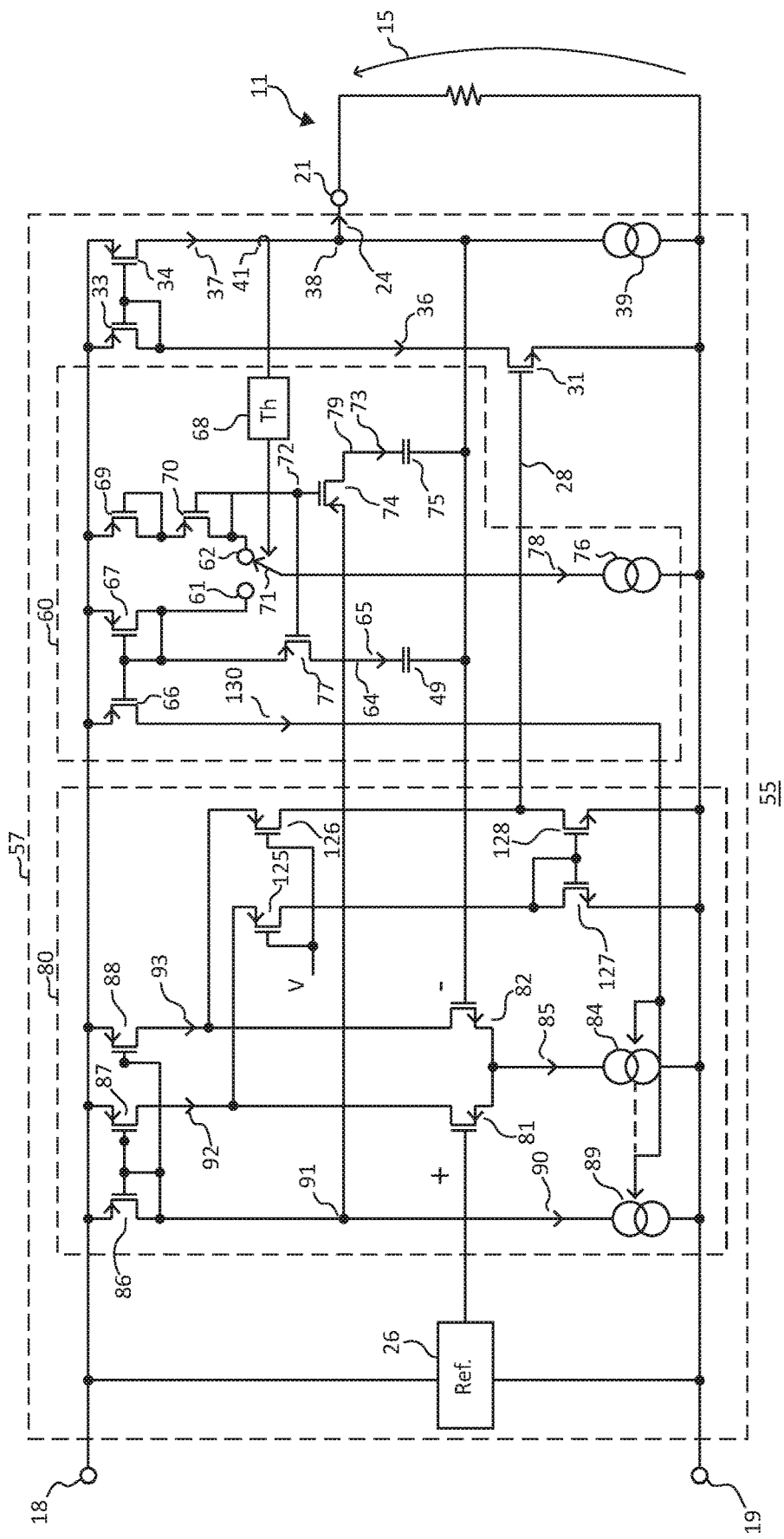
FIG. 2 schematically illustrates a portion of an example of an embodiment of an LDO system that may be an alternate embodiment of the system of FIG. 1 in accordance with the present invention.

FIG. 2 schematically illustrates a portion of an example of an embodiment of an LDO system 55 that may have an embodiment that may be an alternate embodiment of system 10 of FIG. 1. System 55 includes an LDO regulator 57 that may have an embodiment that may be an alternate embodiment of regulator 16 of FIG. 1. Regulator 57 may have an embodiment that may include an error amplifier 80 and a bias control circuit 60, that each may have an embodiment that may be an alternate embodiment of amplifier 27 and circuit 42, respectively. Amplifier 80 includes a differential pair that includes transistors 81 and 82 which are connected to a common mode current source 84 that provides a bias current 85 for transistors 81 and 82. Current 85 flows through source 84. Transistors 81 and 82 also receive a bias current for each leg of the differential amplifier from a current mirror that includes transistors 87 and 88, respectively, connected in a current mirror configuration with a transistor 86. Transistor 86 conducts a current 90 that is formed by a current source 89. Transistor 86 is ratioed to transistors 87 and 88 so that each of transistors 87 and 88 provide respective currents 92 and 93 through each leg of the differential amplifier to respective transistors 81 and 82. Currents 92 and 93 are proportional to current 90. An embodiment may include that currents 92 and 93 are substantially equal. In an embodiment, source 89 and transistors 86-88 may be an embodiment of source 29 illustrated in FIG. 1.

Transistors 125 and 126, respectively, are connected to transistors 81 and 82 to in a folded cascode configuration. Transistors 125 and 126 are connected to a current mirror formed by the connection of transistors 127 and 128, respectively. The configuration of transistors 125-126 and 127-128 buffer signal 28 from transistors 81-82 sources 87-88. The output of amplifier 80 to form signal 28 is taken from the drain of transistor 128.

Bias control circuit 60 includes transistors 69 and 70 connected in a diode configuration, transistors 66 and 67 connected in a current mirror configuration, a steering circuit (for example a switch 71), and a current source 76. Circuit 60 also includes a bias adjust circuit. An embodiment of the bias adjust circuit may include adjustment transistors 74 and 77, and capacitors 49 and 75 that are connected to respective transistors 77 and 74. An embodiment of circuit 60 may also include a threshold circuit 68. Some embodiments of circuit 60 may include sensor 41. Circuit 60 also includes a buffer circuit that may have an embodiment that includes current mirror connected transistors 66 and 67. In some embodiments, the buffer circuit may be omitted.

Figure 3:
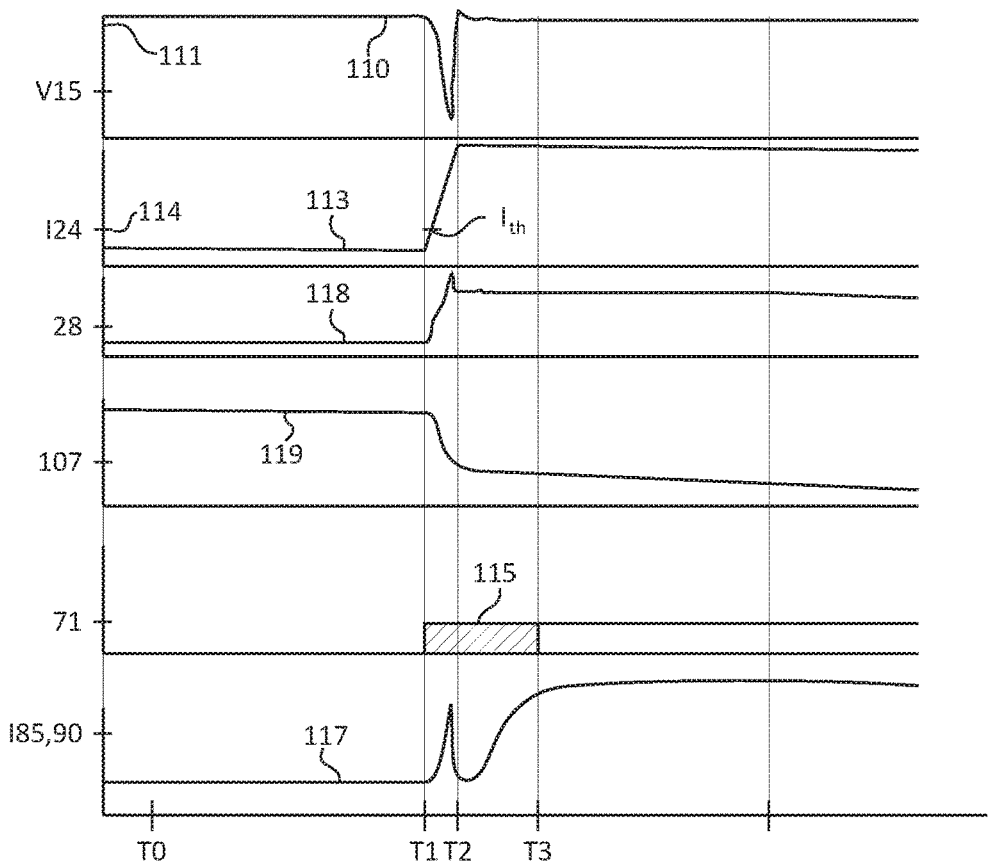
FIG. 3 is a graph having plots that illustrate examples of some of the signals that may be formed during operation of an embodiment of the system of FIG. 1 or FIG. 2 in accordance with the present invention.

FIG. 3 is a graph having plots that illustrate examples of some of the signals that may be formed during operation of an example of an embodiment of regulator 57 or alternately regulator 16. A plot 110 illustrates output voltage 15, a plot 113 illustrates the value of current 37 which is representative of current 24, a plot 115 illustrates the control signal to the steering circuit (such as to switch 71), and a plot 117 illustrates an example of a waveform of either of bias adjust signals 64 or 79. The ordinate indicates time and the abscissa indicates increasing value of the illustrated signal.

Assume that at a time T0 load 11 is in a reduced power mode and requires a small value of current 24 as is illustrated by plot 113. Thus, the value of current 24 is less than the threshold (Ith) value. Although the value of current 24 is small, amplifier 80 controls transistor 31 to form the value of voltage 15 to the desired value such as proportional to the value of Ref 26. Circuit 60 is configured to detect that the value of current 24 is less than the threshold (Ith) value (such as the value formed by circuit 68 for example) and responsively control the steering circuit to connect amplifier 80 to the bias adjust circuit in a configuration to receive signals 64 and 79 and/or currents 65 and 73 from circuit 60. In response to detecting that current 24 is less than Ith, an embodiment of circuit 60 may be configured to connect a terminal or node 62 to current source 76. Current 78 then flows through diode connected transistors 69 and 70 to source 76. Current 78 causes transistors 69-70 to form a voltage at terminal 62 that enables transistor 74 and 77 to become conducting. An embodiment may include that current 78 causes the voltage at terminal 62 to be greater than the gate-source threshold voltage of transistors 66, 74, 77, and 86.

An embodiment may include that enabling transistor 77 may connect current source 84 to receive signal 64 or alternately to bias adjust current 65. In an embodiment, source 89 may also be connected to receive signal 64 or current 65. For example, enabling transistor 77 may connect source 84, or sources 84 and 89, to one terminal of capacitor 49 through the current mirror of transistors 67 and 66. Also, enabling transistor 74 may connect the current mirror of transistors 86-88 to receive signal 79 or alternately current 73. For example, enabling transistor 74 may connect one terminal of capacitor 75 to the common current leg of the current mirror of transistors 86-88 such as at node 91.

Because output voltage 15 is regulated and is substantially stable, there is no current flow through capacitors 49 and 75. Thus, even though amplifier 80 is connected to circuit 60 through transistors 77 and 74, thus configured to receive signals 64 and 79 (or currents 65 and 73) to increase the bias current, amplifier 80 still has bias currents 85 and 92-93, such as for example a first value of currents 85 and 92-93, as the bias current for amplifier 80. Thus, in an embodiment, enabling transistors 74 and 77 connects amplifier 80 to the bias adjust circuit in a configuration so that amplifier 80 may subsequently receive a bias control signal and have an increased bias current or second bias current. In another embodiment, enabling transistors 74 and 77 connect amplifier 80 to circuit 60 in a configuration so that amplifier 80 may subsequently receive signals 64 and 79 to increase bias current 85 or alternately currents 85 and 92-93 thereby increasing the bias current of amplifier 80.

Assume that at a time T1, load 11 changes and requires a higher value of current 24. As illustrated by plot 113, the value of current 24 begins to increase. Because circuit 60 has not yet adjusted the bias current of amplifier 80, amplifier 80 may have a long transient response time so that amplifier 80 would take an amount of time to respond and begin changing the value of voltage 15. This causes the value of voltage 15 to decrease as illustrated by plot 110. The decrease in voltage 15 pulls node 38 to a lower voltage which pulls one terminal of capacitors 49 and 75 low. The lower voltage applied to capacitors 49 and 75 causes a current through each of capacitors 49 and 75.

Because transistor 77 is enabled, current 65 through capacitor 49 forms a representative current 130 through transistor 66. Current 130 is applied to current sources 84 and 89. Currents 65 and 130 can have an embodiment as signal 64 which causes sources 84 and 89 to increase the value of respective currents 85 and 90. For example, sources 84 and 89 may be variable current sources such that signal 64 causes sources 84 and 89 to increase the value of respective currents 85 and 90. Another embodiment may be configured such that current 65 or alternately current 130 may be an adjust current that is summed to currents 85 and 90 to thereby increase the value of currents 85 and 90. Plot 117 illustrates between times T1 to T2 the increase of currents 85 and 90 resulting from current 65. The increased value of current 90 is mirrored through transistors 87-88 as a corresponding increase in respective currents 92 and 93. The increase in currents 92-93 is proportional to current 65 through capacitor 49. The increased value of current 85 increases the common mode current and the individual transistor currents of transistors 81 and 82. The increase in current 85 is proportional to current 65.

Because transistor 74 is enabled, current 73 through capacitor 75 is applied to current source 89 at node 91 which increases the value of current 90 through transistor 86 and source 89 thereby increasing the value of currents 92 and 93 and thereby increasing the bias current for amplifier 80. Plot 117 illustrates between times T1 to T2 the increase in current 90 as a result of current 73. It has been found that applying current 73 to node 91 causes regulator 57 to more quickly restore voltage 15 to the desired value, than just using current 65 or signal 64. Increasing bias currents 85 and 92-93 to amplifier 80 allows amplifier 80 to more rapidly increase the signal on output 28 and more rapidly cause a corresponding increase in voltage 15 as is illustrated by plots 111 and 117 between times T1-T2. Those skilled in the art will appreciate that the value of currents 65 and 73 may decrease as time progresses as is illustrated by plot 117 near time T2.

Assume that at a time T2, current 24 increases to be no less that the threshold (Ith) value. In response, circuit 60 decouples amplifier 80 from the bias adjust circuit and returns the bias current to the first value. In an embodiment, in response to detecting that the value of current 24 increased to no less than the threshold (Ith) value, circuit 60 decouples amplifier 80 from receiving currents 65 and 73 or from receiving signals 64 and 79. An embodiment may include that in response to detecting that the value of current 24 increased to no less than the threshold (Ith) value, steering circuit 71 causes circuit 60 to decouple amplifier 80 from receiving currents 65 and 73. In response to the value of current 24 increasing to no less than the threshold (Ith) value, an embodiment of circuit 71 disables transistors 74 and 77 so that amplifier 80 does not receive currents 65 and 73 or signals 64 and 79. For example, in response to detecting that current 24 is no less than the threshold (Ith) value, circuit 60 connects switch 71 to terminal or node 61 so that current 78 no longer flows through transistors 69 and 70 but flows through transistor 67 to current source 76. Therefore, the voltage at node 62 and on the gates of transistors 74 and 77 increases to a value near the voltage on terminal 18 thus transistors 74 and 77 are disabled.

After time T2, current 130 continues to increase because source 76 is now connected to terminal 61. This continues to increase the bias currents to amplifier 80 which continues to increase output voltage 15 to the desired value.

Assume that at a later time such as illustrated at a time 14, load 11 reduces power consumption to a value such that current 24 again decreases to less than the threshold (Ith) value. Circuit 60 responsively connects amplifier 80 to circuit 60 or alternately to the bias adjust circuit, in a configuration to receive currents 65 and 73 or alternately signals 64 and 79. Circuit 60 may again enable transistors 74 and 77 to couple amplifier 80 in a configuration to receive signals 64 and 79 or alternately currents 65 and 73. Since voltage 15 is substantially stable, there are no currents through transistors 74 and 77 and amplifier 80 remains biased by currents 85 and 92-93, such as at the first value for example.

In order to facilitate the hereinbefore functionality, a source of transistor 86 is commonly connected to terminal 18, a source of transistor 87, a source of transistor 88, a source of transistor 66, a source of transistor 67, a source of transistor 69, a source of transistor 33, and a source of transistor 34. A drain of transistor 86 is commonly connected to a gate of transistor 86, a gate of transistor 87, a gate of transistor 88, a source of transistor 74, and a first terminal of source 89. A drain of transistor 87 is commonly connected to a drain of transistor 81 and a source of transistor 93. A source of transistor 81 is commonly connected to a source of transistor 82 and a first terminal of source 84. A second terminal of source 84 is connected to terminal 19. A drain of transistor 82 is commonly connected to a drain of transistor 88 and a source of transistor 94. A gate of transistor 81 is connected to the output of Ref 26. A gate of transistor 82 is commonly connected to a first terminal of capacitor 49, a first terminal of capacitor 75, and to node 38. A drain of transistor 125 is commonly connected to a drain of transistor 127, a gate of transistor 127, and a gate of transistor 128. A source of transistor 127 is connected to a source of transistor 128 and to terminal 19. A drain of transistor 126 is commonly connected to a drain of transistor 128 and a gate of transistor 31. The source of transistor 31 is connected to terminal 19. A drain of transistor 66 is connected to a control input of source 84 and a control input of source 89. A gate of transistor 66 is commonly connected to a gate of transistor 67, a drain of transistor 67, a source of transistor 77, and terminal 61. A drain of transistor 77 is connected to a second terminal of capacitor 49. A gate of transistor 77 is commonly connected to a gate of transistor 74, a drain of transistor 70, terminal 62, and a gate of transistor 70. A drain of transistor 74 is connected to a second terminal of capacitor 75. A source of transistor 70 commonly connected to a drain of transistor 69 and to a gate of transistor 69. A common terminal of switch 71 is connected to a first terminal of source 76 which has a second terminal connected to terminal 19. Threshold circuit 68 has an input connected to an output of current sensor 41, and has an output connected to a control input of switch 71.

Figure 4:
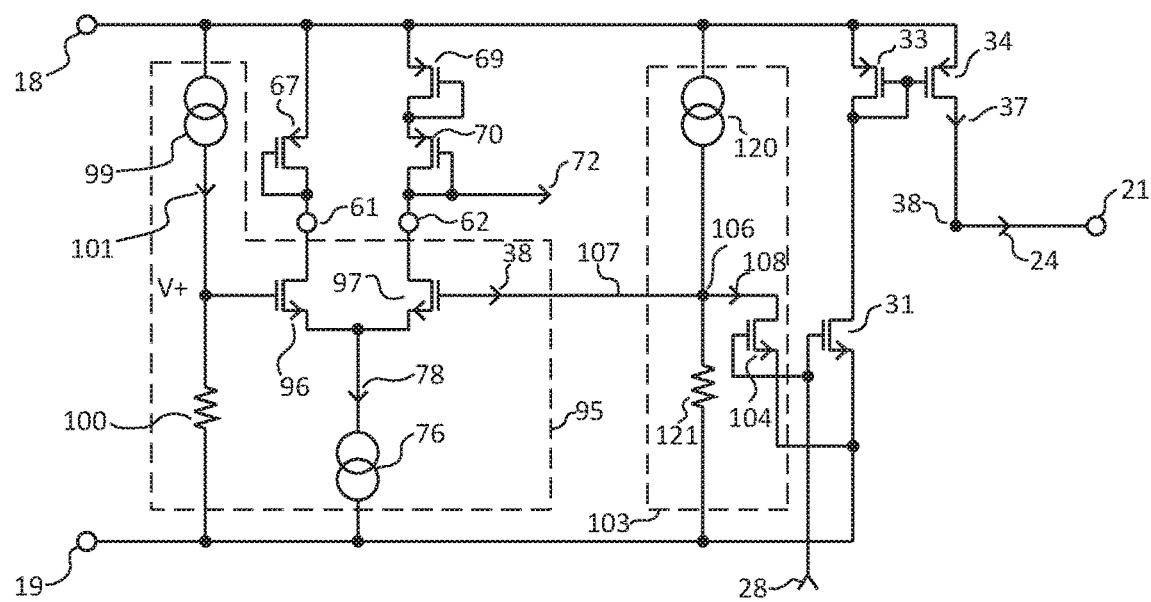
FIG. 4 schematically illustrates a portion of an example of an embodiment of a steering circuit that may be an alternate embodiment of one of the circuits of FIG. 2 in accordance with the present invention.

FIG. 4 schematically illustrates a portion of an example of an embodiment of a steering circuit 95 and a threshold circuit 103 that may have an embodiment that may be an alternate embodiment of respective circuits 71 and 68 of FIG. 2. Circuit 95 includes a differential pair of transistors 96 and 97 that are commonly coupled to source 76 which is configured as a common mode current source. Transistor 96 receives a reference voltage (V+) from a reference circuit. In an embodiment, the reference circuit may include a current source 99 that forms a current 101 to flow through resistor 100 and form the reference voltage (V+).

Threshold circuit 103 is configured to detect the value of current 24 being greater than or less than the threshold (Ith). Transistor 97 receives a control signal 107 from node 106 of circuit 103. Circuit 103 includes a sense transistor 104 that is ratioed to the area of transistor 31 so that a current through transistor 104 is proportional to current 36 through transistor 31. Such sensing transistors are well-known to those skilled in the art and in some embodiments may be referred to as a SenseFET.

As long as current 24 is less than the threshold (Ith), current 108 through transistor 104 is much lower than the current from source 120. In some embodiments, current 108 may be substantially zero. Thus, the value of signal 107 is substantially equal to the reference voltage (V+). Transistors 96 and 97 are formed so that the width-to-length (W/L) ratio of transistor 97 is greater than the width-to-length (W/L) ratio of transistor 96. An embodiment may include that the width-to-length (W/L) ratio of transistor 97 is more than 10 times the width-to-length (W/L) ratio of transistor 96. Thus, transistor 97 conducts most of current 78 through transistors 69 and 70. An embodiment may include that transistor 97 conducts substantially ninety five percent or more of current 78. Consequently, almost no current flows through transistor 67. Consequently, the voltage at terminal 61 is close to the voltage at terminal 18. Conversely, when current 24 is greater than the threshold (Ith), current 108 increases which causes signal 106 to decrease to a value less than the reference voltage (V+). This causes transistor 96 to conduct current 78 through transistor 67. Thus, the voltage at terminal 62 comes close to the voltage on terminal 18.

In order to facilitate the herein described functionality, circuit 95 includes a current source 99 having a first terminal connected to terminal 18 and a second terminal commonly connected to a gate of transistor 96 and a first terminal of resistor 100. Resistor 100 has a second terminal commonly connected to terminal 19 and a first terminal of source 76. A second terminal of source 76 is commonly connected to a source of transistor 96 and a source of transistor 97. A drain of transistor 96 is commonly connected to node 61, a drain of transistor 67 and a gate of transistor 67. A drain of transistor 97 is commonly connected to node 62, a drain of transistor 70, and a gate of transistor 70. A gate of transistor 97 is commonly connected to node 106, a drain of transistor 104, a first terminal of resistor 121, and a first terminal of source 120. A second terminal of source 120 is connected to terminal 18. A gate of transistor 104 is commonly connected to the gate of transistor 31. A source of transistor 104 is connected to the source of transistor 31.

Figure 5:
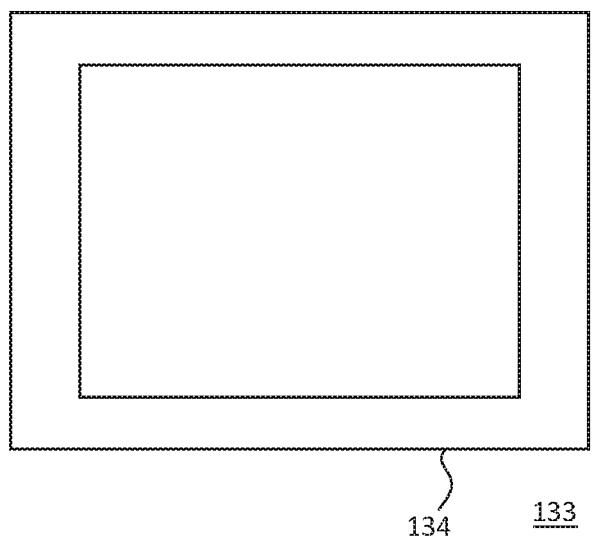
FIG. 5 illustrates an enlarged plan view of a semiconductor device that includes a portion of the system of FIG. 1 or FIG. 2 in accordance with the present invention.

FIG. 5 illustrates an enlarged plan view of a portion of an embodiment of a semiconductor device or integrated circuit 133 that is formed on a semiconductor die 134. In an embodiment, any one of regulators 16 or 57 may be formed on die 134. Die 134 may also include other circuits that are not shown in FIG. 5 for simplicity of the drawing. The integrated circuit 133 may be formed on die 134 by semiconductor manufacturing techniques that are well known to those skilled in the art.

From all the foregoing, one skilled in the art will appreciate that an example of an embodiment of a regulator may be configured as an analog low drop out regulator that may comprise:

the regulator configured for supplying a load current, such as for example current 24 or 37, to a load and forming an output voltage having a desired value;

an error amplifier, such as for example amplifier 27 or 80, configured to receive a reference voltage and form the output voltage having the desired value that is substantially representative of the reference voltage;

a differential pair, such as for example transistors 81 and 82, of the error amplifier configured to conduct a first bias current, such as for example current 85 or currents or current 90, of a first value; and a bias control circuit such as for example circuit 42 or circuit 60, configured form an adjust current, such as for example current 65 or 73, and use the adjust current to control the error amplifier to increase the first bias current from the first value to a second value, the current form by adding in currents 65 or 73, in response to the output voltage decreasing to less than the desired value wherein the load current is less than a threshold value prior to the output voltage decreasing, the bias control circuit configured to decrease the adjust current response to the output voltage returning to substantially the desired value.

In an embodiment, the bias control circuit may decrease the adjust current after the load current increases to greater than the threshold value.

An embodiment of the bias control circuit may include a steering circuit, such as for example circuit 47, or circuit 71, or circuit 95, that couples the error amplifier to receive a control current in response to the load current having a value that is less than the threshold value, and to decouple the error amplifier from the control current in response to the load current increasing to greater than the threshold value.

An embodiment of the error amplifier may include a variable current source, such as for example current sources 84 or 89 or the court source of transistors 86-88, that conducts the first bias current and wherein the bias control circuit controls the variable current source to change the first value to the second value.

The regulator may have an embodiment bias control circuit includes a capacitor, such as for example capacitor 49 or capacitor 75, configured to form a control current, such as for example the currents 65 or 73, in response to the output voltage decreasing wherein the bias control circuit selectively couples, such as controlling through switch 71 and/or transistors 74 and 77, the error amplifier to receive the control current to change the first value to the second value.

An embodiment of the bias control circuit may be configured to decouple the, such as for example through switch 71 or circuit 95, error amplifier from the control current in response to the load current being substantially greater than the threshold value.

An embodiment of the bias control circuit may include a first capacitor, such as for example capacitor 49 or 75, coupled to receive the output voltage and configured to form a first control current, such as for example current 65 or 73, in response to the output voltage decreasing.

the bias control circuit is configured to couple the first control current, such as for example current 64, to a first variable current source, such as for example source 84, that is coupled commonly to both transistors of the differential pair.

The bias control circuit may have an embodiment that includes a second capacitor, such as for example capacitor 75 coupled to receive the output voltage and configured to form a second control current, such as for example current 73, in response to the output voltage decreasing.

The regulator may have an embodiment wherein the bias control circuit is configured to couple a second variable current source, such as the current source of transistors 86-88, of the error amplifier to receive the second control current, such as for example current 73, wherein the second variable current source supplies a second bias current, such as for example current 92 increased by current 73, to a first transistor of the differential pair and supplies a third bias current, such as for example current 93 increase by current 73, to a second transistor of the differential pair wherein the second bias current is substantially equal to the third bias current.

An embodiment may include that the bias control circuit may include a steering circuit, such as for example circuit 71 or circuit 95, to selectively couple a control current from the bias control circuit to the error amplifier to increase the first value to the second value.

In an embodiment, the bias control circuit may include a first capacitor, such as for example capacitor 49 coupled to receive the output voltage, a first transistor, such as for example transistor 77, configured to couple a first control current, such as for example current 65, from the first capacitor to a control terminal of a first variable current source, such as for example source 84, the first variable current source commonly coupled to a second transistor, such as for example transistor 82, and a third transistor, such as for example transistor 81, of the differential pair to conduct the first bias current, such as for example current 85.

An embodiment may also include a second capacitor, such as for example capacitor 75, coupled to receive the output voltage, a fourth transistor, such as for example transistor 74, configured to couple a second control current from, such as for example current 73, the second capacitor to a control terminal of a second variable current source, such as for example the current source of transistors 86-88, the second variable current source having a first output coupled to the second transistor and having a second output coupled to the third transistor.

Those skilled in the art will also appreciate that an example of a method of forming a low dropout regulator may comprise:

configuring an output, such as for example output 21 or output 28, for forming an output voltage and an output current for supplying to a load;

configuring an error amplifier, such as for example amplifier 27 or 80, to receive a reference voltage and form the output voltage having a desired value;

configuring the low dropout regulator to selectively couple the error amplifier to a bias adjust circuit responsively to the output current having a value that is less than a threshold value wherein the bias adjust circuit subsequently forms an adjust signal to have a value that increases a bias current of the error amplifier from a first value to a second value in response to the output voltage decreasing to less than the desired value; and configuring the bias adjust circuit to subsequently decouple the error amplifier from receiving the adjust signal in response to the output current increasing to no less than the threshold value.

The method may also include configuring a differential pair of the error amplifier to conduct the bias current of the first value.

An embodiment may include configuring a variable current source of the error amplifier to form the bias current.

The method may also have an embodiment that includes configuring the bias adjust circuit to not change the first value in response to output voltage changes subsequently to the output current being greater than the threshold value.

Another embodiment may include configuring the bias adjust circuit to form the control current as a current through a capacitor in response to the output voltage decreasing and to couple the control current to a current source of the error amplifier to change the first value to the second value.

Those skilled in the art will also appreciate that an example of a method of forming a low drop out regulator may comprise:

configuring an error amplifier, such as for example amplifier 27 or 80, of the low drop out regulator to receive a reference voltage and form an output voltage having a desired value and form an output current;

configuring a bias control circuit to selectively increase a bias current of the error amplifier from a first value to a second value in response to the output voltage decreasing to less than the desired value; and configuring the bias control circuit to subsequently decouple the error amplifier from receiving the control current in response to the output current increasing to no less than a threshold value.

The method may also have an embodiment that may include configuring the bias control circuit to selectively couple the error amplifier for receiving the control current in response to the output current decreasing to less than the threshold value.

Those skilled in the art will appreciate that a regulator configured as an analog low drop out regulator may comprise:

the regulator configured for supplying a load current to a load and forming an output voltage having a desired value;

an error amplifier configured to receive a reference voltage and form the output voltage having the desired value that is substantially representative of the reference voltage;

a differential pair of the error amplifier configured to conduct a first bias current of a first value; and a bias control circuit configured form an adjust current and use the adjust current to control the error amplifier to increase the first bias current from the first value to a second value in response to the output voltage decreasing to less than the desired value wherein the load current is less than a threshold value prior to the output voltage decreasing, the bias control circuit configured to decrease the adjust current response to the output voltage returning to substantially the desired value.

An embodiment may include that the bias control circuit decreases the adjust current after the load current increases to greater than the threshold value.

In an embodiment the bias control circuit may include a steering circuit that couples the error amplifier to receive a control current in response to the load current having a value that is less than the threshold value, and to decouple the error amplifier from the control current in response to the load current increasing to greater than the threshold value.

An embodiment of the bias control circuit may include a first capacitor coupled to receive the output voltage and configured to form a first control current in response to the output voltage decreasing and to couple the first control current to a first variable current source that is coupled commonly to both transistors of the differential pair.

In an embodiment the bias control circuit may include a second capacitor coupled to receive the output voltage and configured to form a second control current in response to the output voltage decreasing.

Another embodiment may include a first capacitor coupled to receive the output voltage, a first transistor configured to couple a first control current from the first capacitor to a control terminal of a first variable current source, the first variable current source commonly coupled to a second transistor and a third transistor of the differential pair to conduct the first bias current.

Those skilled in the art will appreciate that a low dropout regulator may comprise:

an output for forming an output voltage and an output current for supplying to a load;

an error amplifier configured to receive a reference voltage and form the output voltage having a desired value;

a circuit to selectively couple the error amplifier to a bias adjust circuit responsively to the output current having a value that is less than a threshold value wherein the bias adjust circuit subsequently forms an adjust signal to have a value that increases a bias current of the error amplifier from a first value to a second value in response to the output voltage decreasing to less than the desired value; and the bias adjust circuit configured to subsequently decouple the error amplifier from receiving the adjust signal in response to the output current increasing to no less than the threshold value.

An embodiment may include that the bias adjust circuit forms the control current as a current through a capacitor in response to the output voltage decreasing and to couple the control current to a current source of the error amplifier to change the first value to the second value.

Those skilled in the art will understand that a low drop out regulator may comprise:

an error amplifier to receive a reference voltage and form an output voltage having a desired value and form an output current; and a bias control circuit configured to selectively increase a bias current of the error amplifier from a first value to a second value in response to the output voltage decreasing to less than the desired value wherein the bias control circuit subsequently decouples the error amplifier from receiving the control current in response to the output current increasing to no less than a threshold value.

An embodiment may include that the bias control circuit selectively couples the error amplifier for receiving the control current in response to the output current decreasing to less than the threshold value.

In view of all of the above, it is evident that a novel device and method is disclosed. Included, among other features, is forming a LDO regulator to increase a bias current to an error amplifier of the LDO regulator in response to the a decrease in the output voltage and to decouple the error amplifier from receiving the increased bias current in response to the output current increasing to greater than a threshold value.

While the subject matter of the descriptions are described with specific preferred embodiments and example embodiments, the foregoing drawings and descriptions thereof depict only typical and non-limiting examples of embodiments of the subject matter and are not therefore to be considered to be limiting of its scope, it is evident that many alternatives and variations will be apparent to those skilled in the art. As will be appreciated by those skilled in the art, the example form of regulators 16 and 57 are used as a vehicle to explain the operation method of detecting the current level and how to temporarily increase the bias currents. Those skilled in the art will appreciate that other detailed circuit configurations may be used to form, among other things, the current sensor and the steering circuits described herein.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A regulator configured as an analog low drop out regulator comprising:

the regulator configured for supplying a load current to a load and forming an output voltage having a desired value;

an error amplifier configured to receive a reference voltage and form the output voltage having the desired value that is substantially representative of the reference voltage;

a differential pair of the error amplifier configured to conduct a first bias current of a first value; and a bias control circuit configured form an adjust current and use the adjust current to control the error amplifier to increase the first bias current from the first value to a second value in response to the output voltage decreasing to less than the desired value wherein the load current is less than a threshold value prior to the output voltage decreasing, the bias control circuit configured to decrease the adjust current response to the output voltage returning to substantially the desired value.

2. The regulator of claim 1 wherein the bias control circuit decreases the adjust current after the load current increases to greater than the threshold value.

3. The regulator of claim 1 wherein the bias control circuit includes a steering circuit that couples the error amplifier to receive a control current in response to the load current having a value that is less than the threshold value, and to decouple the error amplifier from the control current in response to the load current increasing to greater than the threshold value.

4. The regulator of claim 1 wherein the error amplifier includes a variable current source that conducts the first bias current and wherein the bias control circuit controls the variable current source to change the first value to the second value.

5. The regulator of claim 1 wherein the bias control circuit includes a capacitor configured to form a control current in response to the output voltage decreasing wherein the bias control circuit selectively couples the error amplifier to receive the control current to change the first value to the second value.

6. The regulator of claim 5 further including the bias control circuit configured to decouple the error amplifier from the control current in response to the load current being substantially greater than the threshold value.

7. The regulator of claim 1 wherein the bias control circuit includes a first capacitor coupled to receive the output voltage and configured to form a first control current in response to the output voltage decreasing.

8. The regulator of claim 7 wherein the bias control circuit is configured to couple the first control current to a first variable current source that is coupled commonly to both transistors of the differential pair.

9. The regulator of claim 7 wherein the bias control circuit includes a second capacitor coupled to receive the output voltage and configured to form a second control current in response to the output voltage decreasing.

10. The regulator of claim 9 wherein the bias control circuit is configured to couple a second variable current source of the error amplifier to receive the second control current wherein the second variable current source supplies a second bias current to a first transistor of the differential pair and supplies a third bias current to a second transistor of the differential pair wherein the second bias current is substantially equal to the third bias current.

11. The regulator of claim 1 wherein the bias control circuit includes a steering circuit to selectively couple a control current from the bias control circuit to the error amplifier to increase the first value to the second value.

12. The regulator of claim 1 wherein the bias control circuit includes a first capacitor coupled to receive the output voltage, a first transistor configured to couple a first control current from the first capacitor to a control terminal of a first variable current source, the first variable current source commonly coupled to a second transistor and a third transistor of the differential pair to conduct the first bias current.

13. The regulator of claim 12 further including a second capacitor coupled to receive the output voltage, a fourth transistor configured to couple a second control current from the second capacitor to a control terminal of a second variable current source, the second variable current source having a first output coupled to the second transistor and having a second output coupled to the third transistor.

14. A method of forming a low dropout regulator comprising:
configuring an output for forming an output voltage and an output current for supplying to a load;
configuring an error amplifier to receive a reference voltage and form the output voltage having a desired value;
configuring the low dropout regulator to selectively couple the error amplifier to a bias adjust circuit responsively to the output current having a value that is less than a threshold value wherein the bias adjust circuit subsequently forms an adjust signal to have a value that increases a bias current of the error amplifier from a first value to a second value in response to the output voltage decreasing to less than the desired value; and
configuring the bias adjust circuit to subsequently decouple the error amplifier from receiving the adjust signal in response to the output current increasing to no less than the threshold value.

15. The method of claim 14 including configuring a differential pair of the error amplifier to conduct the bias current of the first value.

16. The method of claim 15 including configuring a variable current source of the error amplifier to form the bias current.

17. The method of claim 14 including configuring the bias adjust circuit to not change the first value in response to output voltage changes subsequently to the output current being greater than the threshold value.

18. The method of claim 14 including configuring the bias adjust circuit to form the control current as a current through a capacitor in response to the output voltage decreasing and to couple the control current to a current source of the error amplifier to change the first value to the second value.

19. A method of forming a low drop out regulator comprising:
configuring an error amplifier of the low drop out regulator to receive a reference voltage and form an output voltage having a desired value and form an output current;
configuring a bias control circuit to selectively increase a bias current of the error amplifier from a first value to a second value in response to the output voltage decreasing to less than the desired value; and
configuring the bias control circuit to subsequently decouple the error amplifier from receiving the control current in response to the output current increasing to no less than a threshold value.

20. The method of claim 19 including configuring the bias control circuit to selectively couple the error amplifier for receiving the control current in response to the output current decreasing to less than the threshold value.

* * * * *